United States Patent [19]

Eggermont et al.

[11] 4,039,955
[45] Aug. 2, 1977

[54] RECEIVER FOR THE RECEPTION OF SIGNALS TRANSMITTED BY DELTA MODULATION

[75] Inventors: Ludwig Désiré Johan Eggermont; Anton Hendrik Wevers, both of Eindhoven, Netherlands

[73] Assignee: U.S. Philips Corporation, New York, N.Y.

[21] Appl. No.: 639,573

[22] Filed: Dec. 10, 1975

[30] Foreign Application Priority Data

May 2, 1975 Netherlands .......................... 7501341

[51] Int. Cl.² ........................................... H03K 13/22
[52] U.S. Cl. ................................. 325/321; 325/38 B; 332/11 D
[58] Field of Search ........................... 325/38 B, 321; 332/11 D; 329/104

[56] References Cited

U.S. PATENT DOCUMENTS

| | | | |
|---|---|---|---|
| 3,729,678 | 4/1973 | Glasbergen et al. | 325/38 B |
| 3,806,806 | 4/1974 | Brolin | 325/38 B |
| 3,878,465 | 4/1975 | Stephenne et al. | 325/38 B |
| 3,971,987 | 7/1976 | Carruba et al. | 325/38 B |

*Primary Examiner*—Robert L. Griffin
*Assistant Examiner*—Marc E. Bookbinder
*Attorney, Agent, or Firm*—Frank R. Trifari; Simon L. Cohen

[57] ABSTRACT

A receiver in an adaptive pulse code modulation transmission system is provided with a pulse pattern analyzer which is responsive to at least two sequential information pulses, and a correction circuit controlled by the pulse pattern analyzer for correcting the last transmitted pulse group.

12 Claims, 9 Drawing Figures

RECEIVER FOR THE RECEPTION OF SIGNALS TRANSMITTED BY DELTA MODULATION

The invention relates to a delta modulation receiver comprising a delta modulation signal decoder including a stepsize control circuit varied in accordance with a number of discrete weighting factors as a function of the pulse pattern of a pulse group $P_K$ constituted by the relevant information pulse $I_K$ at the instant $t_k$ and at least a preceding information pulse $I_{k-1}$ at the instant $t_{K-1}$, said receiver being provided for this purpose with a pulse pattern analyzer for distinguishing the different pulse patterns $P_K$ and for controlling the stepsize control circuit.

Such a receiver is of special importance for the reception of signals transmitted by adaptive pulse delta modulation such as, for example, the type of pulse code modulation denoted by High Information Delta modulation (H.I.D.M.) in which the weighting factors of the stepsize control are determined by the pulse group $P_K$ constituted by the relevant information pulse $I_k$ at the instant $t_k$ and the two preceding information pulses $I_{k-1}$, $I_{k-2}$ at the instants $t_{k-1}$, $t_{k-2}$. Dependent on the pulse pattern of the occurring pulse group $P_K$ a stepsize is allotted to the relevant information pulse $I_k$ in accordance with one of the weighting factors in the discrete range of numbers $2^{-1}$, $2^0$, $2^1$ relative to the stepsize associated with the preceding information pulse $I_{k-1}$. The invention may also be used advantageously in receivers for other types of adaptive pulse code modulation, for example, as described in "The Bell System Technical Journal" of March 1970, volume 49, number 3, pages 321–342.

It is an object of the invention to realize a considerable reduction in the quantization noise within and beyond the signal band in a receiver as described above for the reception of signals transmitted by adaptive pulse code modulation simultaneously with an improvement in the reproduction quality, or conversely in case of the same reproduction quality and quantization noise, to reduce the pulse frequency while using a minimum of additional means.

The receiver according to the invention is characterized in that it further comprises a pulse pattern analyzer for the pulse group $Q_K$ composed of information pulses of the pulse group $P_K$ and at least one information pulse $I_{k+1}$ subsequent to the pulse group $P_K$ at the instant $t_{k+1}$ and a correction device controlled by a control circuit forming part of the pulse pattern analyzer for the pulse group $Q_K$, said circuit being arranged to effect a correction of the approximation signal at the output of the decoder in response to the occurrence of at least one predetermined pulse pattern in the pulse group $Q_K$.

The invention and its advantages will now be described in greater detail with reference to the Figures.

FIGS. 2 and 4 show further embodiments of the receiver according to the invention and FIG. 3 shows two time diagrams to explain the operation of the receivers according to FIGS. 2 and 4, while

Figure 1:
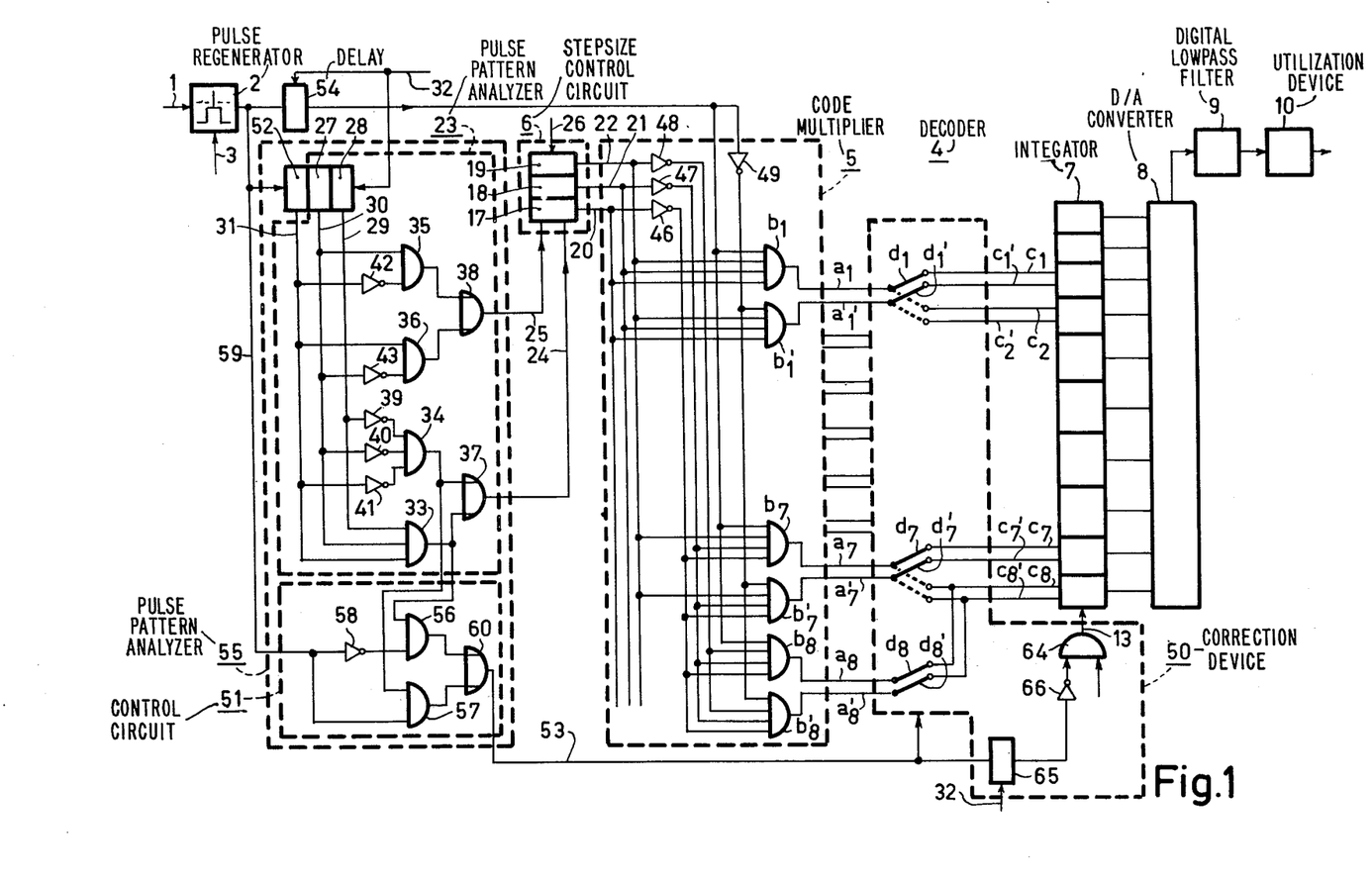
FIG. 1 shows a possible embodiment of the receiver according to the invention.

The receiver shown in FIG. 1 is constructed entirely using digital techniques for the reception of speech signals in the band of from 300–3400 Hz which are transmitted by High Information Delta modulation (H.I.D.M.). The information pulse signals received through lead 1 are applied to a pulse regenerator 2 which is controlled through a clock pulse lead 3 by local clock pulses from a local clock pulse generator not shown in the Figure. The frequency of the local clock pulse generator is synchronized accurately in known manner with the frequency of the incoming information pulse signals.

To decode the incoming information pulse signals of 1 and 0 pulses the signal path in said receiver is provided with a decoder 4 connected to the pulse regenerator 2 and comprising the cascade arrangement of a code multiplier 5 for multiplication of the regenerated information pulses by a stepsize characterized by pulse groups, which stepsize originates from a stepsize control circuit 6, an integrator 7 connected to a clock pulse lead 13 for integrating the output pulses from the code multiplier 5 and a digital-to-analog converter 8 connected to the output of the integrator 7. The output signal of the digital-to-analog converter 8 is a stepsized approximation of the analogue signal or speech signal transmitted by pulse code modulation. After being smoothed in a digital lowpass filter 9 of the non-recursive type for the purpose of suppressing the unwanted pulse frequencies and quantization noise located beyond the speech band, this output signal is applied to a utilization device 10, which is for example, in the form of a reproduction device or a pulse code modulator for converting the obtained approximation signal into a pulse code characterized by pulse groups.

Whenever an information pulse occurs this pulse is multiplied in the code multiplier 5 by the stepsize associated with this pulse and characterized by the pulse group of the stepsize control circuit 6. Consequently, a pulse is generated on one of the parallel output leads $a_1$, $a'_1 \ldots a_7, a'_7; a_8, a'_8$ of the code multiplier 5 as determined by a 1 or 0 information pulse and the associated stepsize which in HIDM forms part of the discrete series of numbers $2^m$ where $m = 0, 1, 2 \ldots$ Thus the said code multiplier for the 1 and 0 information pulses has eight pairs of output leads $a_1, a'_1 \ldots a_7, a'_7; a_8, a'_8$ for the different stepsizes in the series of numbers $2^0, 2^1 \ldots 2^7$. For example, the output leads $a_1$ and $a'_1$ correspond to a 1 and a 0 information pulse of the stepsize $2^7$, while the output leads $a_8$ and $a'_8$ correspond to a 1 and a 0 information pulse of the stepsize $2^0$ and so forth.

In the integrator 7 which has parallel inputs $c_1, c'_1 \ldots c_7, c'_7; c_8, c'_8$ the obtained output pulse of the code multiplier 5 is combined with the sum of all preceding output pulses so that a corresponding variation occurs in the pulse group at the parallel output terminals of the integrator 7 resulting in the digital-to-analog converter 8 in a stepsize variation of its output signal. The integrator 7 is of a known type, for example, a feedback accumulator, a counter or the like.

In accordance with the HIDM transmission of the information pulses the stepsize at the next information pulse $I_k$ is varied in accordance with one of the weighting factors $2^{-1}$, $2^0$ or $2^1$ as a function of the pulse pattern of the pulse group $P_K$ constituted by the information pulse $I_K$ at the instant $t_k$ and the two preceding information pulses $I_{k-1}$, $I_{k-2}$ at the instants $t_{k-1}$, $t_{k-2}$, while the output pulse derived from the relevant output leads $a_1, a'_1 \ldots a_7, a'_7; a_8, a'_8$ of the code multiplier 5 after integration in the integrator 7, will cause a corresponding variation in the output signal of the digital-to-analog converter 8, and so forth. Thus the stepsized approximation signal which is applied to the utilization device 10 through the low-pass filter 9 is produced at the output of the digital-to-analog converter 8.

To generate the stepsizes associated with the different information pulses the stepsize control circuit 6 is formed as an up-down counter connected to a clock pulse lead 26 and having three counting stages 17, 18, 19 with three counting leads 20, 21, 22. The counting position is controlled by means of a pulse pattern analyzer 23 connected to the pulse regenerator 2 and having two output leads 24, 25 in conformity with the HIDM principle. According to this principle the stepsize located in the discrete series of numbers $2^m$ as a function of the $n$ possible pulse patterns $P_{n,k}(n = 1, 2 \ldots 8)$ of the information pulse $I_K$ and the two preceding information pulses $I_{k-1}$, $I_{k-2}$ with the weighting factors $G_k$ of $2^{-1}$, $2^0$, $2^1$ is varied in accordance with the table below.

| $P_{n,k}$ | $I_{k-2}$ | $I_{k-1}$ | $I_k$ | $A_k$ | $B_k$ | $G_k$ |
|---|---|---|---|---|---|---|
| 1 | 0 | 0 | 1 | 0 | 1 | $2^{-1}$ |
| 2 | 1 | 0 | 1 | 0 | 1 | $2^{-1}$ |
| 3 | 0 | 1 | 1 | 0 | 0 | $2^0$ |
| 4 | 1 | 1 | 1 | 1 | 0 | $2^1$ |
| 5 | 0 | 0 | 0 | 1 | 0 | $2^1$ |
| 6 | 1 | 0 | 0 | 0 | 0 | $2^0$ |
| 7 | 0 | 1 | 0 | 0 | 1 | $2^{-1}$ |
| 8 | 1 | 1 | 0 | 0 | 1 | $2^{-1}$ |

In the up-down counter 6 the counting position given by the pulse group on the counting leads 20, 21, 22 characterizes the exponent $m$ of the stepsize in the series of numbers $2^m$ which stepsize is varied on the occurrence of each information pulse $I_k$ as a function of the then occurring pulse pattern $P_{n,k}$ and is represented by the output signals $A_k$, $B_k$ on the output leads 24, 25 in conformity with the exponent of the weighting factor of $-1, 0, 1$. In more detail, in the embodiment shown for the pulse groups $P_{1,k}$, $P_{2,k}$, $P_{7,k}$, $P_{8,k}$ it is; a variation of the counting position by one unit corresponding to a weighting factor $G_k$ of $2^{-1}$; no variation of the counting position for the pulse patterns $P_{3,k}$, $P_{6,k}$ corresponding to a weighting factor $G_k$ of $2^0$; and a variation of the counting position by one unit for the pulse patterns $P_{4,k}$, $P_{5,k}$ corresponding to a weighting factor $G_k$ of $2^1$.

To realize this control of the up-down counter 6 the pulse pattern analyzer 23 is provided with a shift register having two shift register elements 27, 28 and leads 29, 30, 31 connected to these shift register elements 27, 28. The contents of the shift register elements 27 and 28 are shifted by clock pulses from clock pulse lead 32. The pulse pattern analyzer 23 is also provided with four AND-gates 33, 34, 35, 36, the AND-gates 33, 34 being connected through an OR-gate 37 to the output lead 24 for the output signal $A_K$ and the AND-gates 35, 36 being connected through an OR-gate 38 to the output lead 25 for the output signal $B_k$. Only when equal pulses $I_k$, $I_{k-1}$, $I_{k-2}$ occur does the OR-gate 37 apply a 1 pulse as an output signal $A_k$ to the output lead 24, because all leads 29, 30, 31 of the shift registers 27, 28 are connected directly and through invertors 39, 40, 41, respectively, to the AND-gates 33, 34, while the OR-gate 38 only applies a 1 pulse as an output signal $B_k$ to the output lead 25 in case of opposite pulses $I_k$, $I_{k-1}$ at the leads 31, 30, because the AND-gates 35, 36 are connected directly and through invertors 42 and 43, and directly to the leads 30, 31, respectively. The output signals $A_k$, $B_k$ at the output leads 24, 25 of the pulse pattern analyzer 23 are included in the previous table for the sake of convenience.

Dependent on the pulse patterns $P_{1,k}$, $P_{2,k}$, $P_{7,k}$, $P_{8,k}$; $P_{3,k}$, $P_{6,k}$; $P_{4,k}$, $P_{5,k}$ the output signals $A_K$, $B_k$ on the output leads 24, 25 of the pulse pattern analyzer 23 are represented according to the table by 0, 1; 0, 0; 1, 0, which in this sequence produce a variation of $-1$; 0; 1 of the exponent $m$ of the stepsize located in the series $2^m$ in accordance with the weighting factors $G_k$ applying for these pulse patterns. In this way, the stepsize-characterizing pulse groups are produced at the output of the stepsize control circuit 6, which groups are applied through counting leads 20, 21, 22 to the code multiplier 5 for multiplication of the information pulses $I_k$ by the associated stepsize in the series of numbers $2^0, 2^1 \ldots 2^7$.

For this purpose the code multiplier 5 for the 1 and 0 information pulses includes eight pairs of AND-gates $b_1, b'_1 \ldots b_7, b'_7; b_8, b'_8$ with outputs constituted by the said leads $a_1, a'_1 \ldots a_7, a'_7; a_8, a'_8$. Each of the eight different AND-gates $b_1 \ldots b_7; b_8$ for the 1 information pulses is connected directly and through invertors 46, 47, 48, respectively, to all counting leads 20, 21, 22, in the eight possible combinations and each of the eight different AND-gates $b'_1 \ldots b'_7; b'_8$ for the 0 information pulses is similarly connected. Further, all AND-gates $b_1 \ldots b_7; b_8$ for 1 information pulses are connected directly to the output of the pulse regenerator 2, whereas all AND-gates $b'_1 \ldots b'_7; b'_8$ for the 0 information pulses are connected through an invertor 49 to the output of the pulse regenerator 2. Thus an output pulse will be generated only at the output lead of the code multiplier 5 as determined by the occurrence of a 1 or 0 information pulse and the pulse group on the counting leads 20, 21, 22, which output pulse characterizes the step as to polarity and stepsize in the series of numbers $2^m$. For example, in the case of the pulse group 111 on the counting leads 20, 21, 22 and for a 1 information pulse, in the said embodiment an output pulse will occur at the output lead $a_1$ characteristics of a positive step of the stepsize $2^7$ and for a 0 information pulse at the output lead $a'_1$ characteristic of a negative step of the same stepsize; in the case of the pulse group 100 on the counting leads and for a 1 information pulse an output pulse occurs at the output lead $a_7$ which is characteristic of a positive step of the stepsize $2^1$ and for a 0 information pulse an output pulse occurs at the output terminal $a'_7$ characteristic of a negative step of likewise the stepsize $2^1$, and so forth.

To explain the operation of the arrangement shown, FIG. 5 shows some time diagrams. In FIG. 5$a$ the reference $p$ denotes the speech signal to be transmitted and the reference $q$ denotes the stepsize approximation signal at the output of the digital-to-analog converter 8, while FIG. 5$b$ shows the incoming binary pulse series of 1 and 0 information pulses.

Starting from an initial position information pulses $I_1$, $I_2$ occur at the instants $t_1$, $t_2$ resulting in positive steps of for example equal stepsize $2^3$. At the instant $t_3$ a 1 information pulse $I_3$ occurs which according to the previous table constitutes the pulse pattern $P_{4,k}$ with the information pulses $I_1$, $I_2$ corresponding to a weighting factor $G_k$ of $2^1$ and thus to a positive step of the stepsize $2^4$; at the instant $t_4$ a 0 information pulse $I_4$ occurs which together with the pulses $I_2$ and $I_3$ constitutes the pulse group $P_{8,k}$ corresponding to the weighting factor $G_k$ of $2^{-1}$ and thus to a negative step of the stepsize $2^3$. Continuing in this manner, the stepsize approximation signal $q$ of FIG. 5$a$ is built up at the output of the digital-to-analog converter 8, which signal is applied for further processing through the lowpass filter 9 to the user 10.

In the foregoing there is illustrated the construction and operation of a HIDM-receiver which as is common practice is identical to the auxiliary receiver present in the return loop of the HIDM-transmitter.

According to the invention a considerable improvement in the reproduction quality and a reduction of the quantization noise is obtained if, by departing from the established teaching that the receiver proper and the auxiliary receiver in the transmitter should be identical, the receiver in addition comprises a pulse pattern analyzer 55 for a pulse group $Q_K$ composed of information pulses of the pulse group $P_K$ and at least one information pulse $I_{k+1}$ subsequent to the pulse group $P_K$ at the instant $t_{k+1}$ and a correction circuit 50 controlled by a control circuit 51 forming part of the pulse pattern analyzer 55 for the pulse group $Q_K$, which control circuit is adapted to effect a correction of the approximation signal at the output of the decoder in response to the occurrence of at least one predetermined pulse pattern in the pulse group $Q_K$. Instead of a separate pulse pattern analyzer the pulse pattern analyzer for the pulse group $Q_K$ is formed by extending the already present pulse pattern analyzer 23 for the pulse group $P_K$ with a control circuit 51 connected thereto supplying the control signal for the correction circuit 50.

The Applicant has found that the reproduction quality and quantization noise are mainly affected by the occurrence of certain pulse patterns $Q_{j,k}$ in the larger pulse groups $Q_K$ notably the pulse patterns $Q_{1,k}$, $Q_{2,k}$ of the pulse groups composed of the pulse patterns $P_{4,k}$, $P_{5,k}$ consisting of equal information pulses $I_k$, $I_{k-1}$, $I_{k-2}$ at the instants $t_k$, $t_{k-1}$, $t_{k-2}$ followed by an opposite information pulse $I_{k+1}$ at the instant $t_{k+1}$. More specifically the said larger pulse patterns are represented by the compositions 1110 and 0001 which occur in the time diagrams in FIG. 5 during the periods of time $t_1$-$t_4$ and $t_9$-$t_{12}$.

In the embodiment shown a shift register element 52 is added to the shift register elements 27, 28 of the pulse pattern analyzer 23 for distinguishing the pulse patterns of the larger pulse groups $Q_K$, while the control circuit 51 is connected to the pulse pattern analyzer 23 and is adjusted in such a manner that on the occurrence of the pulse pattern $Q_{1,k}$ or $Q_{2,k}$ a control signal in the form of a 1 pulse is generated, which brings about a correction of the stepsize approximation signal by controlling the correction circuit 50 through a lead 53. In order to compensate for the delay in the control of the code multiplier 5 caused by the additional shift register element 52 of the pulse pattern analyzer 23, a shift register element 54 having a delay of one clock period is also incorporated between the pulse regenerator 2 and the code multiplier 5, which shift register element is likewise controlled by clock pulses from the clock pulse lead 32.

To generate the control signal the control circuit 51 comprises two AND-gates 56, 57 and an OR-gate 60. As shown in the Figure AND-gate 56 has one input connected directly to the output of AND-gate 33, and another input connected through an invertor 58 to the output of pulse regenerator 2, whereas AND-gate 57 has its inputs connected to the output of AND-gate 34 and the output of pulse regenerator 2 respectively. The outputs of the two AND-gates 56, 57 are connected through OR-gate 60 to the lead 53 for the control of the correction circuit 50. On the occurrence of the pulse patterns $Q_{1,k}$ and $Q_{2,k}$ the AND-gates 56 and 57 supply a 1 pulse as a control signal through the OR-gate 60 to the lead 53, which control signal controls the correction circuit 50. This correction circuit has two correction positions, one for the correction of the stepsize approximation signal at the instant of the step associated with the information pulse $I_k$ and another associated with the information pulse $I_{k+1}$. Particularly in the said embodiment the step associated with the information pulse $I_k$ is halved in one correction position and the step associated with the information pulse $I_{k+1}$ is suppressed in the other correction position.

In the said correction circuit 50 the means for halving the step associated with the information pulse $I_k$ are constituted by 8 pairs of electronic switches $d_1$, $d'_1$ ... $d_8$, $d'_8$ three pairs of which are shown symbolically in the Figure by the switches $d_1$, $d'_1$ and $d_7$, $d'_7$; $d_8$, $d'_8$ the normal switching position of which, as shown in the Figure by solid lines, connects the code multiplier output leads $a_1$, $a'_1$ ... $a_7$, $a'_7$; $a_8$, $a'_8$ to the integrator inputs $c_1$, $c'_1$ ... $c_7$, $c'_7$, $c_8$, $c'_8$ of the same stepwise $2^m$. The other switching position corresponding to the stepsize halving, as shown in the Figure by the broken lines, connects the code multiplier output leads $a_1$, $a'_1$ ... $a_7$, $a'_7$; $a_8$, $a'_8$ to the integrator inputs $c_2$, $c'_2$ ... $c_8$, $c'_8$ of half the stepsize $2^{m-1}$. For example, in case of halving a stepsize the code multiplier output leads $a_1$, $a'_1$ associated with the 1 or 0 information pulse of the stepsize $2^7$ are connected to the integrator outputs $c_2$, $c'_2$ for the 1 or 0 information pulses of the stepsize $2^6$. To suppress the step associated with the information pulse $I_{k+1}$ the correction circuit 50 is provided with an AND-gate 64 incorporated in the clock pulse lead 13 of the integrator 7, which gate is fed at one input by the clock pulses from the clock pulse lead 13 and at the other input by the control signal from lead 53 through the cascade arrangement of an invertor 66 and a delay element in the form of a shift register element 65 having a delay time which is equal to one clock period and which is connected to clock pulse lead 32.

The operation of the described receiver will now be described in greater detail with reference to the time diagram shown in FIG. 5c.

First, assuming neither the pulse pattern $Q_{1,k}$ (of composition 1110) nor the pulse pattern $Q_{2,k}$ (of composition 0001) to be present at the input of the pulse pattern analyzer 55, the control circuit 51 does not provide a 1 pulse as a control signal and therefore the electronic switches $b_1$, $b'_1$ ... $b_8$, $b'_8$ will be in the normal switching position and the clock pulses occurring in the rhythm of the incoming information pulses will be applied through the AND-gate 64 to the integrator 7. Accordingly in this state of operation the described receiver behaves as if control circuit 51 and correction circuit 50 were absent and the stepsize approximation signal $q'$ at the output of the digital-to-analog convertor 8 corresponds to the stepsize approximation signal $q$ in FIG. 5a.

Figure 5B:
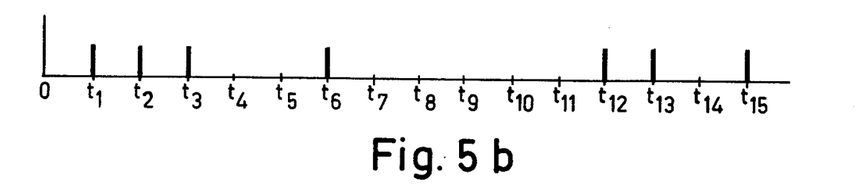
FIG. 5 shows time diagrams to explain the receivers shown in FIGS. 1, 2 and 4.
Figure 5C:
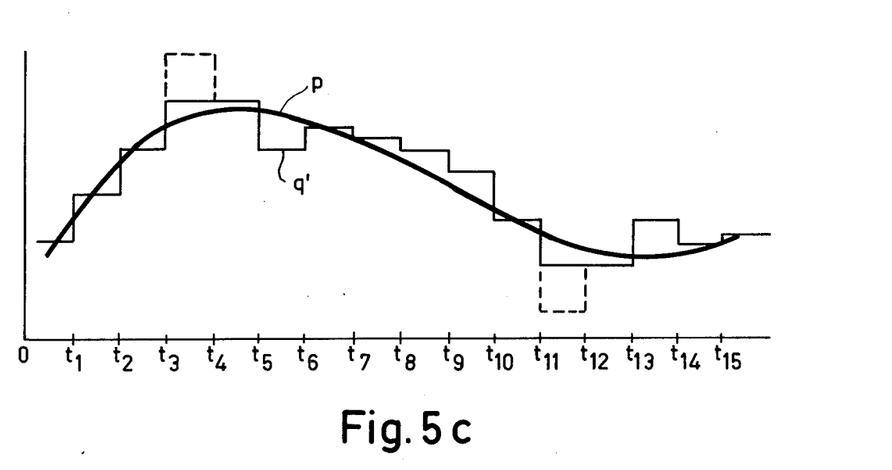

However, when the pulse pattern $Q_{1,k}$ or $Q_{2,k}$ does occur at the input of the pulse pattern analyzer 55, for example at the instants $t_3$ and $t_{11}$ in FIG. 5c, a 1-pulse is applied as a control pulse through the OR-gate 60 of the control circuit 51 to the lead 53, which signal halves the stepsize of the then occurring information pulse $I_k$ at the instants $t_3$ and $t_{11}$, respectively, in the first correction position by changing over the relevant electronic switch. On the other hand the control signal is applied to the AND-gate 64 and realizes a clock pulse suppression after a delay of one clock period in the shift register element 65 and an inversion in the invertor 66. This clock pulse suppression in the second correction position in the integrator 7 results in a suppression of the step associated with the information pulse $I_{k+1}$ at the instants $t_4$ and $t_{12}$. To illustrate the realized correction, FIG. 5c shows broken lines illustrating the stepsizes of the information pulses $I_k$, $I_{k+1}$ at the instants $t_3$, $t_4$ and $t_{11}$, $t_{12}$, respectively, for a receiver without control and correction circuits (compare also FIG. 5a).

A considerable improvement of the speech quality and of the quantization noise is realized with simple digital circuits using the new teaching according to the invention. More specifically the improvement of the quantization noise within the speech band was approximately 4 dB and beyond the speech band it was more than 5 dB. This improvement by more than 5 dB of the quantization noise beyond the speech band resulted in a considerable simplification of the requirements and the construction of the digital lowpass filter of the non-recursive type at the output of the digital-to-analog convertor 8. Particularly, the length of the delay circuit in the digital lowpass filter 9 could be reduced by more than 10% resulting in a minimum of additional elements for constructing the receiver according to the invention.

Figure 2:
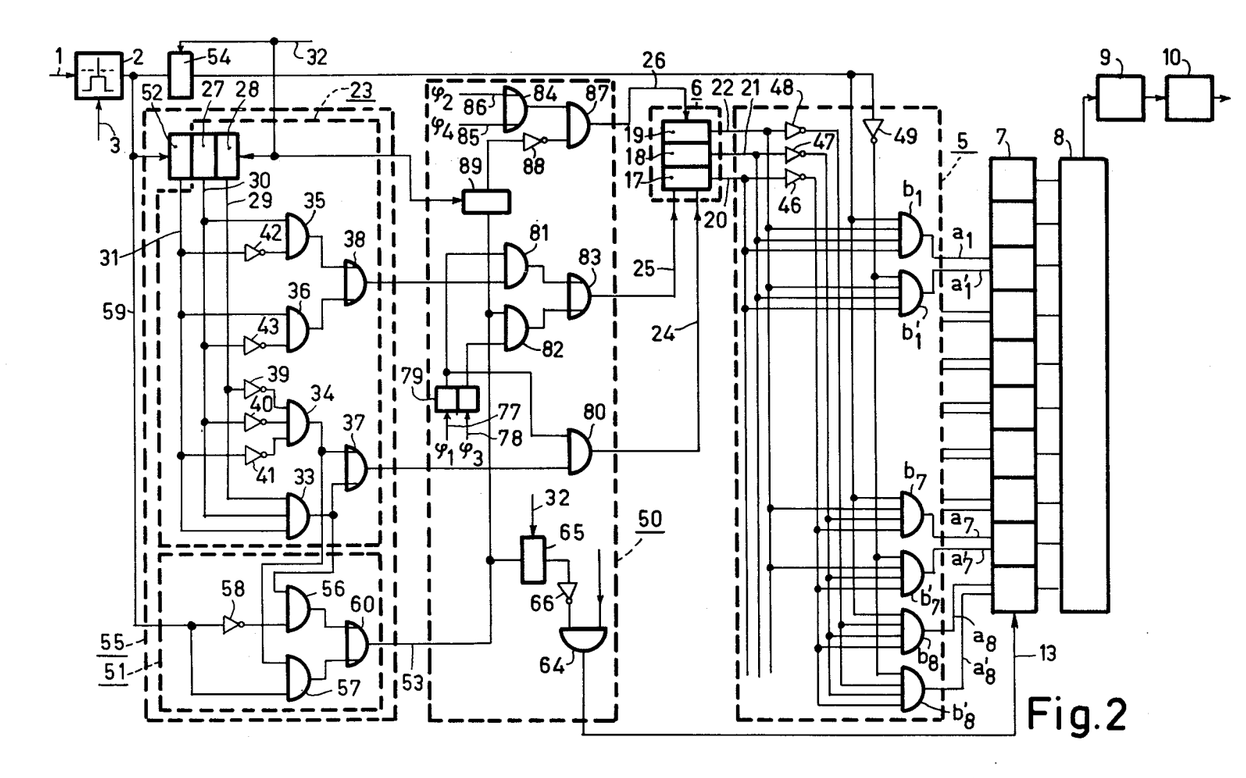

FIG. 2 shows a modification of the receiver shown in FIG. 1 with which the correction of the approximation signal q' is realized in the manner as in FIG. 5c. As in FIG. 1, the step associated with the information pulse $I_{k+1}$ is suppressed in this receiver with the aid of AND-gate 64 in the clock pulse lead 13 of the integrator 7 and the inventor 66 arranged in cascade therewith and shift register element 65, but in this case the stepsize of the step associated with the information pulse $I_k$ is halved through a correction circuit connected to the input of the stepsize control circuit 6.

In addition to the control of the stepsize control circuit 6 by the pulse pattern analyzer 23 for the pulse group $P_K$ through the output leads 24, 25 the correction circuit 50 controlled by the control circuit 51 is also connected to the stepsize control circiut 6 which in this embodiment corrects every time within one clock period the adjustment of the stepsize control circuit 6 through the output leads 24, 25.

For this purpose the correction circuit 50 in this embodiment of the receiver includes a timing circuit in the form of a bistable trigger 79 controlled by phase shifted clock pulses from clock pulse leads 77, 78. In one stable state it connects the pulse pattern analyzer 23 for the pulse group $P_K$ through the output leads 24, 25 to the stepsize control circuit 6 by enabling AND-gates 80, 81 and in the other stable state it connects the control circuit 51 to the stepsize control circuit by enabling AND-gate 82 which together with the AND-gate 81 is connected by means of an OR-gate 83 to the output lead 25. Moreover, two clock pulse leads 85, 86 for mutually phase shifted clock pulses are connected to the stepsize control circuit 6 through an OR-gate 84, which in each clock period successively realize the stepsize adjustment by the pulse pattern analyzer 23 for the pulse group $P_K$ and by the control circuit 51 for the pulse group $Q_{k,1}$, $Q_{k,2}$, if any.

Figure 3A:
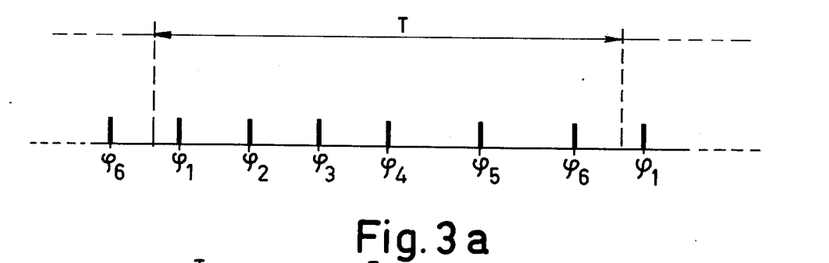
Figures 3B, 5A:
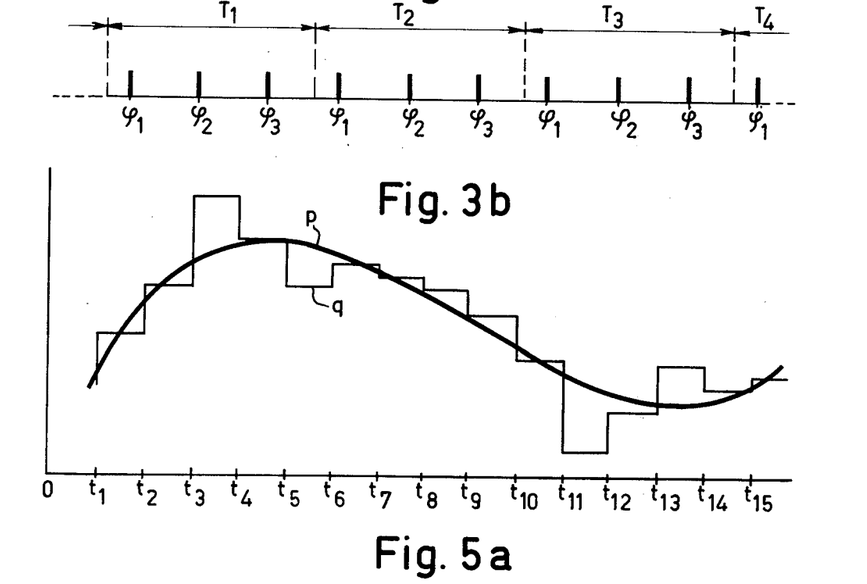

As seen in the time diagram of FIG. 3a the pulse pattern analyzer 23 and the control circuit 51 will be connected to the stepsize control circuit 6 in each clock period T on the occurrence of the clock pulses $\phi_1$ and $\phi_3$ on clock pulse leads 77 and 78, respectively, of the bistable trigger 79 while on the occurrence of the clock pulses $\phi_2$ and $\phi_4$ on the clock pulse leads 85 and 86, respectively, of the OR-gate 84 the relevant adjustments are realized. Thus in each clock period the corrected stepsize in pulse group form is produced at the counting leads 20, 21, 22 which after processing in the code multiplier 5 is integrated in the integrator 7 on the occurrence of the clock pulse $\phi_5$ on the clock pulse lead 13.

In more detail, the control circuit 51 will produce the output signals $A_k$, $B_k$ of the value 0, 0 on the output leads 24, 25 in the condition in which the control circuit 51 is connected to the stepsize control circuit 6 in the absence of the pulse patterns $Q_{1,k}$ and $Q_{2,k}$ which according to the foregoing table will not cause any variation in the adjustment by the pulse pattern analyzer 23 in the previous period of time. However, when the pulse patterns $Q_{1,k}$ or $Q_{2,k}$ occurs, the control circuit 51 will introduce the output signals $A_k$, $B_k$ of the value 0,1 on the output leads 24, 25 which according to the foregoing table results in a correction by the weighting factor $2^{-1}$ of halving the stepsize of the information pulse $I_k$ in the first correction state, which is in full conformity with the embodiment of FIG. 1.

Likewise in conformity with the receiver in FIG. 1 the step associated with the subsequent information pulse $I_{k+1}$ is the step associated with the subsequent information pulse $I_{k+1}$ is suppressed in the second correction state for the correction by the clock pulse suppressor 64, 65, 66, 32 on the clock pulse lead 13 of the integrator 7. However, in this embodiment the adjustment of the stepsize control circuit 6 is suppressed in the clock period subsequent to the information pulse $I_k$ by means of a clock pulse suppressor in the clock pulse leads 85, 86 of the stepsize control circuit 6. It is achieved thereby that the stepsize control circuit 6, after carrying out the said correction, has the correct adjustment that is to say, as if control circuit 51 and correction circuit 50 were absent. As in the clock pulse lead 13 of the integrator 7 the clock pulse suppressor in the clock pulse leads 85, 86 of the stepsize control circuit 6 includes the cascade arrangement of an AND-gate 87, an inventor 88 and a shift register element 89 with a clock pulse lead 32 connected thereto. For the sake of completeness the clock pulses $\phi_6$ on the clock pulse lead 32 of the shift register elements 65, 89 are shown in the time diagram of FIG. 3a.

In the same manner as in the time diagram of FIG. 5c the speech signal in the receiver described is followed by the illustrated stepsize approximation signal q'.

Figure 4:
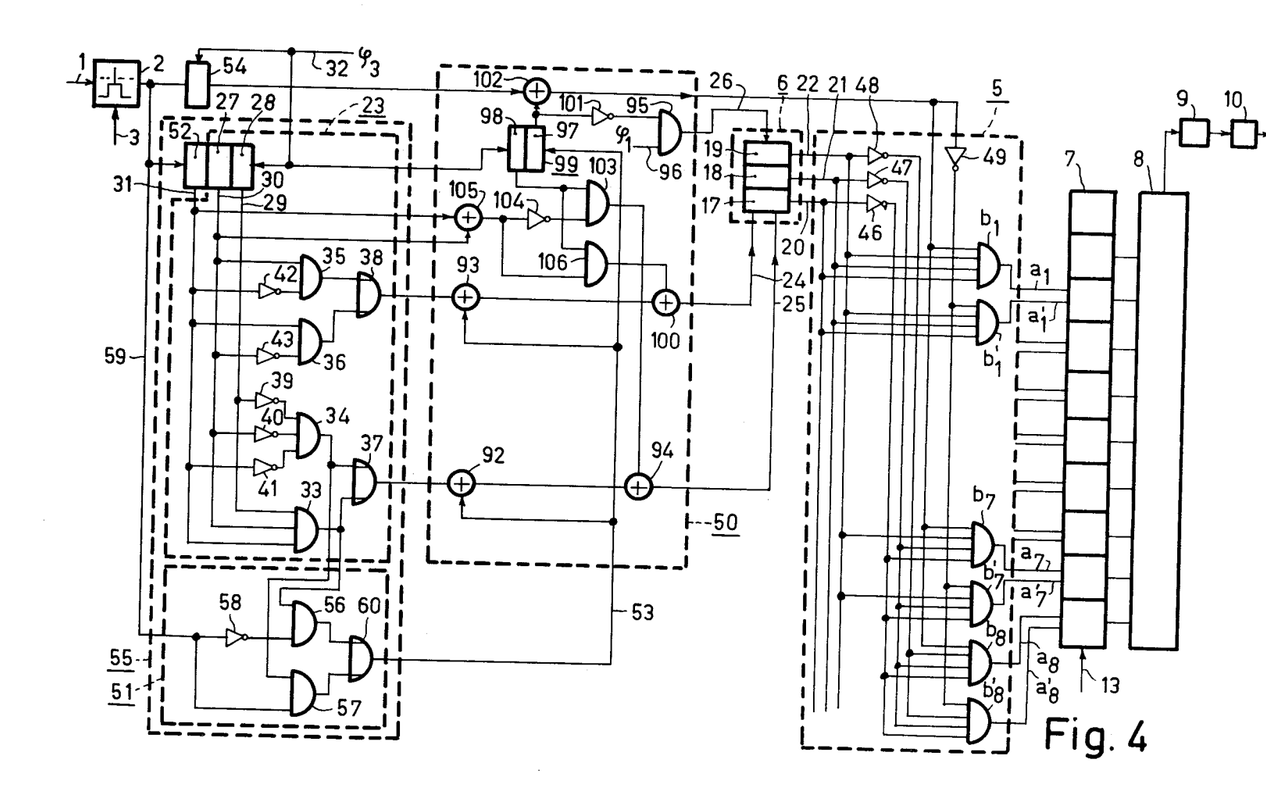

FIG. 4 shows a further embodiment of the receiver according to the invention in which the correction of the approximation signal is likewise realized through a correction circuit connected to the stepsize control circuit 6. However, this embodiment is distinguished from the other embodiments in that without step suppression each of the steps associated with the information pulses $I_k$, $I_{k+1}$ and $I_{k+2}$ is adjusted at a suitable value, i.e. in the first correction state the step associated with the information pulse $I_k$ is adjusted to one quarter of its value while maintaining the polarity in the second correction state the step associated with the information pulse $I_{k+1}$ is adjusted to half its value while reversing its polarity and in the third correction state the step associated with the information pulse $I_{k+2}$, while maintaining its polarity, is adjusted to the normal stepsize corresponding to a variation of the stepsize by a weighting factor of $G_k$ of $2^1$ or $2^0$, dependent on whether the values of the information pulses $I_{k+2}$ and $I_{k+1}$ are equal or different.

In the embodiment shown the correction circuit 50 of the receiver is provided with two exclusive OR-gates 92, 93 incorporated in the output leads 24 and 25, respectively. These exclusive OR-gates are controlled by the control signal applied to these gates which signal is derived from the output of the OR-gate 60 and which assumes the value 1 when the pulse pattern $Q_{1,k}$ or $Q_{2,k}$ occurs. The outputs of the exclusive OR-gates 92 and 93 are connected to the stepsize control circuit 6 through exclusive OR-gates 94 and 100, respectively. A clock pulse lead 96 is connected to the stepsize control circuit 6 through an AND-gate 95. The clock pulse $\phi_1$ applied via this path to the stepsize control circuit 6 cause the stepsize control circuit 6 to carry out the variation of the stepsize adjustment prescribed by the pulse pattern analyzer 23 and control circuit 51. The correction circuit 50 of the receiver furthermore includes a shift register 99 consisting of two shift register elements 97 and 98 to which clock pulses $\phi_3$ are applied through the clock pulse lead 32 and to which the control signal is applied through the lead 53. The output of the first shift register element 97 is connected on the one hand through an invertor 101 to the AND-gate 95 and on the other hand to a control input of an exclusive OR-gate 102 which is incorporated in the lead connecting the output of the shift register element 54 to the code multiplier 5. The output of the second shift register element 98 is connected to the control input of an AND-gate 103 and an AND-gate 106 whose outputs are connected to said exclusive OR-gates 94 and 100, respectively. The output signal from an exclusive OR-gate 105 is applied to the other input of AND-gate 103 through an invertor 104, while the output signals from the shift register elements 52 and 27 of the shift register of the pulse pattern analyzer 55 are applied to this OR-gate. The output signal from the exclusive OR-gate 105 is also applied to the other input of the AND gate 106.

The correction circuit 50 described in the foregoing is brought to the first correction state because the control signal assumes the value 1 when the pulse pattern $Q_{1,k}$ or $Q_{2,k}$ occurs. It is realized thereby that the exclusive OR-gates 92 and 93 do not produce a signal value of 1 and 0 but instead a signal value of 0 and 1 as an output signal, which means that the step associated with the information pulse $I_k$ is adjusted to one quarter of its value at the instant the clock pulse $\phi_1$ (see FIG. 3b) is applied to the stepsize control circuit 6 in the clock period $T_2$. At the instant of occurrence of clock pulse $\phi_3$ in the clock period $T_2$ the correction circuit 50 is brought to the second correction state. More particularly the occurrence of clock pulse $\phi_3$ causes on the one hand the control signal constituted by a 1-pulse to be stored in the first shift register element 97 of shift register 99 and on the other hand the information pulse $I_{k+1}$ to be stored in the shift register element 52 of the shift register of the pulse pattern analyzer 55. In this second correction state the first shift register element 97 of shift register 99 provides an output signal which is applied through the invertor 101 to the AND-gate 95 and brings about the adjustment of the stepsize control circuit 6 so that the step associated with the information pulse $I_{k+1}$ is maintained unchanged because the clock pulse $\phi_1$ occurring during the clock period $T_3$ is suppressed. The output signal occurring in this second correction state at the output of the first shift register element 97 is also applied to the exclusive OR-gate 102 and causes the polarity of the information pulse $I_{k+1}$ applied to the code multiplier 5 to be reversed.

At the instant when the clock pulse $\phi_3$ occurs during the clock period $T_3$ the correction circuit 50 is brought to the third correction state. More particularly the clock signal $\phi_3$ occurring at that instant causes the contents of the first shift register element 97 to be shifted to the second shift register element 98 of shift register 99 and also causes the information pulse $I_{k+2}$ to be stored in the shift register element 52 of the shift register of the pulse pattern analyzer 55. Dependent on whether the value of the information pulse $I_{k+2}$ is equal to or different from that of the information pulse $I_{k+1}$, a 0- and 0-pulse or a 0- and a 1-pulse occur at the outputs of the exclusive OR-gates 92 and 93, respectively. In this third correction state of the correction circuit 50 an output pulse also occurs either at the output of the AND-gate 103 or at the output of the AND-gate 106 dependent on whether the information pulses $I_{k+2}$ and $I_{k+1}$ have an equal or a different value. As a result, the exclusive OR-gates 94 and 100 are controlled in such a manner that they supply a 1 pulse and a 0 pulse, respectively, in the case of equal values of the information pulses $I_{k+2}$ and $I_{k+1}$ with the result that at the instant when the clock pulse $\angle_1$ occurs in the clock period $T_4$ the stepsize in the stepsize control circuit 6 is varied by a weighting factor $G_k = 2^1$, whereas they provide a 0 pulse and a 0 pulse in the case of different values of the information pulses $I_{k+2}$ and $I_{k+1}$, with the result that the stepsize in the stepsize control circuit 6 at the said instant is maintained unchanged. The third correction state of the correction circuit 50 thus causes the stepsize control circuit 6 to have the correct adjustment after the correction has been carried out, that is to say, as if control circuit 51 and correction circuit 50 were absent.

Figure 5D:
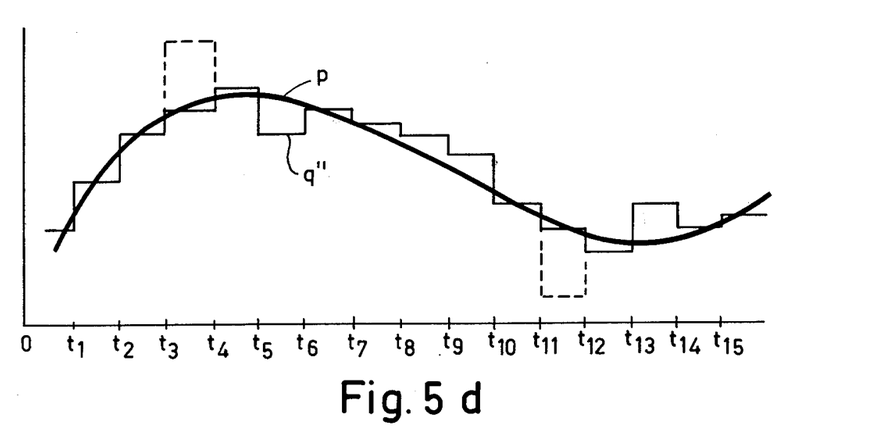

FIG. 5d shows the time diagram according to which the described receiver follows the speech signal $p$ through the stepsize approximation signal $q''$. More particularly the pulse pattern $Q_{1,k}$ occurs at the instant $t_3$ and the pulse pattern $Q_{2,k}$ occurs at the instant $t_{12}$. At the instants $t_3$ and $t_{12}$ the correction circuit 50 is brought to the first correction state and the stepsize, as the Figure shows, is reduced to a quarter of its value.

At the instants $t_4$ and $t_{13}$ the correction circuit 50 is brought to the second correction state and the stepsize remains unchanged, but the polarity is reversed.

At the instants $t_5$ and $t_{14}$ the correction circuit 50 is brought to the third correction state while the stepsize is brought to the normal value and the polarity is maintained.

As FIG. 5d shows the approximation by the stepsize signal $q''$ is more accurate and there is no step suppression so that a reduction in the quantization noise is obtained.

Different aspects of the invention have been explained hereinbefore with reference to a number of embodiments. In addition to the said advantages of a considerable improvement in the reproduction quality by reducing the quantization noise, a complete digital structure and a minimum number of additional digital circuits the said circuit arrangement is distinguished by its complete freedom of use for the different types of code modulation both as regards the modulation type, for example, sigma-delta modulation, pulse group code modulation and the like and the way of adaptation, particularly not only HIDM but, for example, also the adaptative method as described in "The Bell System Technical Journal" of March 1970 volume 49, No. 3, pages 321-342. In addition the pulse pattern for analyzer for performing the correction may be extended to a larger number of preceding and subsequent information pulses, for example, in picture signal transmission for improving the edge steepness in a monochrome transition characterized by a succession of equal information pulses or for suppressing the subsequently occurring decay phenomena characterized by a series of alternately occurring opposite information pulses.

Finally it is to be noted that a series arrangement of the different elements of the receiver may be used instead of the parallel arrangement of these elements without departing from the scope of the present invention.

What is claimed is:

1. A delta modulation receiver comprising means for receiving a pulse pattern of a pulse pattern group $Q_K$ constituted by an information pulse $I_K$ at an instant $t_k$ and a preceding information pulse $I_{K-1}$ at an instant $t_{k-1}$ and an information pulse $I_{K+1}$ subsequent to the pulse $I_K$ at an instant $t_{k+1}$, a pulse pattern analyzer means for distinguishing different pulse patterns of the pulse group $Q_K$ from said receiving means and for providing correction signals and control signals corresponding to said different pulse patterns of said pulse group $Q_K$, a stepsize control circuit means responsive to the control signals from said pulse pattern analyzer means and to the received pulse patterns for multiplying the received pulse patterns by different discrete weighting factors corresponding to said control signals, and correction circuit means and connected to said responsive to said correction signals from said pulse stepsize control circuit means pattern analyzer means for modifying the multiplication of said received pulse patterns.

2. A delta modulation receiver as recited in claim 1, wherein said pulse pattern analyzer means comprises a separate storage element for each of said pulses $I_K$, $I_{K+1}$ and $I_{K-1}$.

3. A receiver as claimed in claim 1, wherein the correcting signal generated by the pulse pattern analyzer for the pulse group $Q_K$ corrects the steps associated with at least two successive information pulses in the correction circuit when predetermined pulse patterns of the pulse group $Q_K$ occur.

4. A receiver as claimed in claim 3, wherein the correction circuit has a delay element for generating a delayed output signal in addition to the correcting signal of the analyzer, said two output signals jointly constituting the control signal for the corrections of the steps associated with at least to successive information pulses.

5. A receiver as claimed in claim 3, wherein the criterion for the analyzer to produce a correcting output pulse consists in the occurrence of a pulse pattern $Q_{1,k}$ of the pulse group $Q_K$ composed of at least three successive equal information pulses $I_k$, $I_{k-1}$, $I_{k-2}$ at the instants $t_k$, $t_{k-1}$, $t_{k-2}$ and a subsequent opposite information pulse $I_{k+1}$ at the instant $t_{k+1}$.

6. A receiver as claimed in claim 4, wherein the correction circuit has a number of correction states to which the correction circuit is successively brought at the occurrence of the predetermined pulse pattern of the pulse group $Q_k$ by the then occurring correcting signal of the analyzer for the purpose of correcting the steps associated with at least two successive information pulses.

7. A receiver as claimed in claim 6, wherein the correction device has an electronic switch which at least in one correction state corrects the stepsize associated with the relevant information pulse.

8. A receiver as claimed in claim 6, wherein the correction circuit comprises means for suppressing the step associated with an information pulse in response to the correction circuit being in a certain correction state.

9. A receiver as claimed in claim 8, wherein the means for suppressing a step are constituted by a clock pulse suppressor incorporated in a clock pulse lead which suppresses the step of the relevant information pulse by suppressing a clock pulse.

10. A receiver as claimed in claim 6, wherein the correction signal of the analyzer and the control signal from the pulse pattern analyzer are both applied through the correction circuit to the input of the stepsize control circuit, said correction circuit correcting the adjustment of the stepsize control circuit whenever said device is in a correction state.

11. A receiver as claimed in claim 10, wherein the correction circuit is built up of logical elements and has an adjusting circuit which after performing the stepsize correction brings the adjustment of the stepsize control circuit to the value as if there were no correction circuit present.

12. A receiver as claimed in claim 10, wherein the correction circuit in each clock period successively realizes the adjustment of the stepsize control circuit under the control of a timing circuit in conformity with the control signal from the pulse pattern analyzer and the correction signal.

* * * * *

UNITED STATES PATENT OFFICE
CERTIFICATE OF CORRECTION

Patent No. 4,039,955          Dated August 2, 1977

Inventor(s) Ludwig Desire Johan Eggermont et al.

It is certified that error appears in the above-identified patent and that said Letters Patent are hereby corrected as shown below:

Section [30] should read as follows:

--[30]     Foreign Application Priority Data

February 5, 1975      Netherlands...............7501341--;

Col. 4, line 23, "linformation" should be --1 information--;

line 36, "characteristics" should be --characteristic--;

Col. 7, line 30, "inventor" should be --invertor--;

Col. 9, line 12, "pulse" should be --pulses--;

Col. 10, line 23, "$\angle_1$" should be -- $\phi_1$ --

Claim 1, line 16, delete "and connected to said";

line 18, delete "stepsize control circuit means".

UNITED STATES PATENT AND TRADEMARK OFFICE
CERTIFICATE OF CORRECTION

PATENT NO. : 4,039,955

DATED : August 2, 1977

INVENTOR(S) : LUDWIG DESIRE JOHAN EGGERMONT ET AL

It is certified that error appears in the above-identified patent and that said Letters Patent are hereby corrected as shown below:

Claim 1, line 18, after "analyzer means" should be --and connected to said stepsize control circuit means--

Signed and Sealed this

Twenty-second Day of November 1977

[SEAL]

Attest:

RUTH C. MASON
*Attesting Officer*

LUTRELLE F. PARKER
*Acting Commissioner of Patents and Trademarks*